INVENTORS
JOSEPH P. VIGNOS
DONALD P. SHOULTES
BY Chester Tavas
AGENT

Jan. 2, 1962 J. P. VIGNOS ET AL 3,015,733

BIPOLAR SWITCHING RING

Filed Jan. 12, 1960 4 Sheets-Sheet 2

United States Patent Office 3,015,733
Patented Jan. 2, 1962

3,015,733

BIPOLAR SWITCHING RING

Joseph P. Vignos, Binghamton, N.Y., and Donald P. Shoultes, Charleston, S.C., assignors to International Business Machines Corporation, New York, N.Y., a corporation of New York Filed Jan. 12, 1960, Ser. No. 1,966
9 Claims. (Cl. 307—88.5)

The invention relates generally to computers and, more specifically, to switching rings. In its more specific aspects, the ring has, by virtue of the nature and arrangement of its transistorized components within the various stages of the ring, the capabilities of providing bipolar characteristics.

In the preferred embodiment of the invention, alternate stages are constructed of logic elements responsive to positive signals and the remaining alternate stages are constructed of logic elements responsive to negative signals. Each stage is comprised basically of AND and OR circuits including means for latching each stage to eliminate pulse overlap. A first stage initially selects and gates through a positive sync signal, issued from a pulse source adapted to provide positive and negative sync signals, to condition the next succeeding stage for operation whereupon, in response to a negative sync signal, the conditioned stage is turned on to provide bipolar output signals.

The principal object of the invention, therefore, resides in the unique arrangement of transistorized components in a ring to provide the latter with bipolar characteristics.

A specific object resides in the provision of a transistorized ring which employs both positive and negative logic, respectively, in alternate groups of stages to provide the ring with bipolar outputs and with the assurance that only one stage will be on in any given time interval of the ring.

The foregoing and other objects, features and advantages of the invention will be apparent from the following more particular description of preferred embodiments of the invention, as illustrated in the accompanying drawings.

Figure 1:
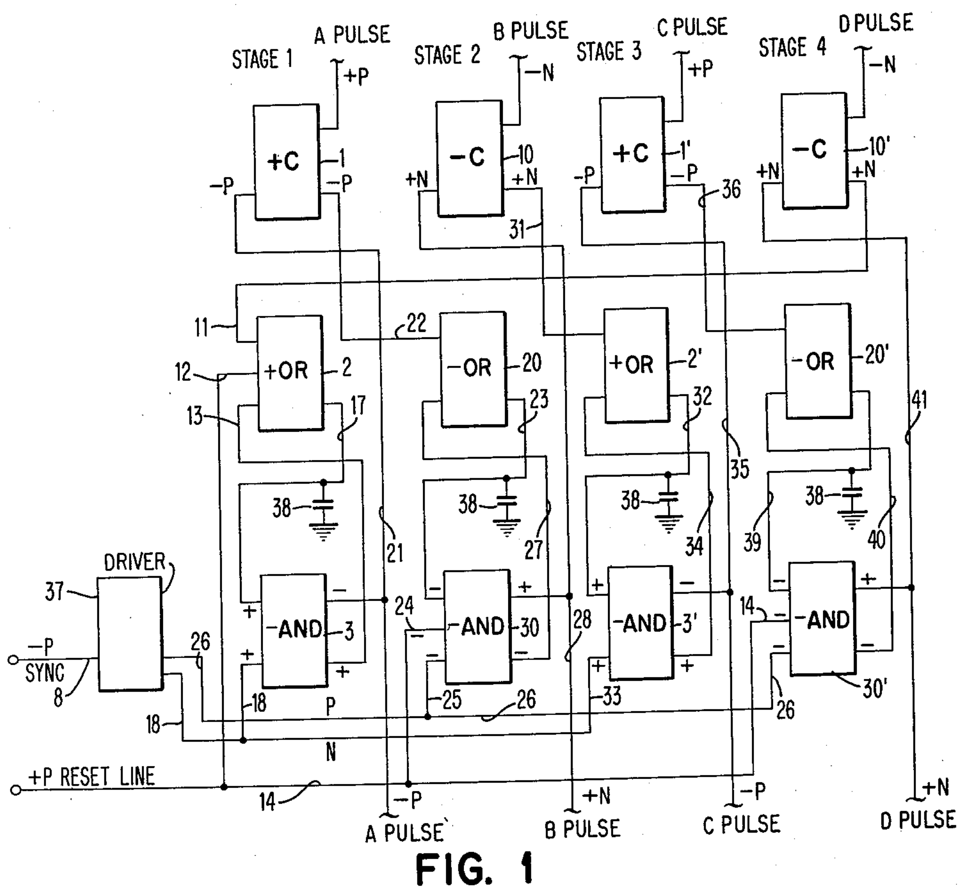
FIG. 1 illustrates one embodiment of a 4-stage ring.

In the circuit configuration of FIG. 1, there is shown a 4-position ring comprising stages 1 through 4. Each stage comprises three basic circuit components; namely, a converter 1, an OR gate 2, and an AND switch 3. The internal structure of stages 1 and 3, as will be more fully described hereinafter, is predicated upon positive logic; whereas, that of stages 2 and 4 is predicated upon negative logic. The components of stage 3 corresponding to stage 1 have primed reference character; namely, 1′, 2′ and 3′, respectively. The components of stage 2 comprise converter 10, OR gate 20 and AND switch 30. The corresponding components of stage 4 are similar to those of stage 2 and bear primed reference characters 10′, 20′ and 30′, respectively.

In the various block designations in the configuration of FIG. 1, input signals are entered from the left side of the blocks while output signals are issued from the right side of the blocks. A line extending from the upper right-hand side of each block issues a signal which is out of phase with respect to the input, while the signal issuing from the line extending from the lower right-hand side of the block issues a signal which is in phase with respect to the input signal. Each logical configuration employs what is known as current mode logic which is characterized by the use of small signal swings that switch well-defined currents from one part of a circuit configuration to another part thereof.

Throughout the description, reference will be made to +N, —N, +P and —P signal lines. These designations have the following significance:

| Line Symbol | Voltage Reference | Nominal Voltage Value |
|---|---|---|
| +N | 0 | +0.8 |
| —N | 0 | —0.8 |
| +P | —6 | —5.2 |
| —P | —6 | —6.8 |

In addition, there are an N sync line, a P sync line and a +P reset line.

Values of the N sync line are as follows:

| Level | Maximum, v. | Minimum, v. | Nominal, v. |
|---|---|---|---|
| Up | +2.18 | +0.87 | +1.50 |
| Down | —2.43 | —0.64 | —1.51 |

P sync line values are as follows:

| Level | Maximum, v. | Minimum, v. | Nominal, v. |
|---|---|---|---|
| Up | —3.08 | —5.40 | —4.13 |
| Down | —9.05 | —6.45 | —7.74 |

Circuit connections of the ring are as follows. Beginning with gate 2, stage 1, the gate 2 includes lines 11, 12 and 13. Line 11 extends from an output of converter means 10′. Line 12 is connected to a +P reset line which also supplies a reset signal to the switches 30 and 30′ of stages 2 and 4, respectively. Line 13 admits the in-phase output signal transmitted from the switch 3. Line 11 is a connection extending from converter 10′, stage 4.

The in-phase output of gate 2 is entered into the top input to the switch 3 by way of a latch back path 17. A +N signal is entered into the lower input to switch 3 by way of a line 18. A coincidence of two input signals on switch 3 thus yields an in-phase output signal on line 13 and an out-of-phase output signal which is transmitted to an input of converter 1 by way of line 21. Coupling between stages 1 and 2 is carried out by way of line 22 which connects the in-phase output of the converter 1 to the input of the negative OR gate 20 of stage 2. The in-phase output of the latter is connected to a line 23, which is connected to an input of a 3-way negative AND switch 30, whose two other inputs are connected to line 24 and 25, respectively; line 24 being connected to the +P reset line 14 and the line 25 being connected to the —P line 26. A coincidence of three negative input signals on the inputs to the negative AND switch 30 causes the latter to yield an in-phase negative signal on the line 27 and an out-of-phase signal on line 28, the line 27 being connected to an input of the negative OR gate 20 and the line 28 being connected to an input of the negative converter 10 of stage 2.

Connections between stage 2 and stage 3 are as follows. The in-phase output of the negative converter 10 is passed on to the positive OR gate 2′ of stage 3 by way of line 31. The in-phase output from the gate 2′ passes on to the positive AND switch 3′ by way of line 32. The positive AND switch 3′ has a second input which is connected to the +N line 18 by way of a line 33.

Coincidence of signals applied to the inputs of the positive AND switch 3′ yields an in-phase output on a latch back path 34 connected to the positive OR gate 2′, and an out-of-phase output on line 35 connected to the positive converter 1', and stage 3.

An inspection of the connections between stages 3 and 4 will show that the connections are similar to those existing between the stages 1 and 2.

The signal swing on the —P line 26 is around a reference line of —6 volts. The swing of the +N line is the same but around a reference line of zero volts. The +N line and the —P line are driven by a suitable driver 37 whose input is connected via line 8 to a source of recurring pulses providing positive and negative signal levels.

Each latch back path in each stage of the ring has a connection to ground by way of a capacitor 38, the purpose of which is to compensate for variations in the switching times of the various transistor components.

In the configuration of FIG. 1, it is seen that stages 1 and 3 comprise one group of stages predicated upon positive logic, while stages 2 and 4 constitute a second or alternate group of stages predicated upon negative logic.

Figure 3:
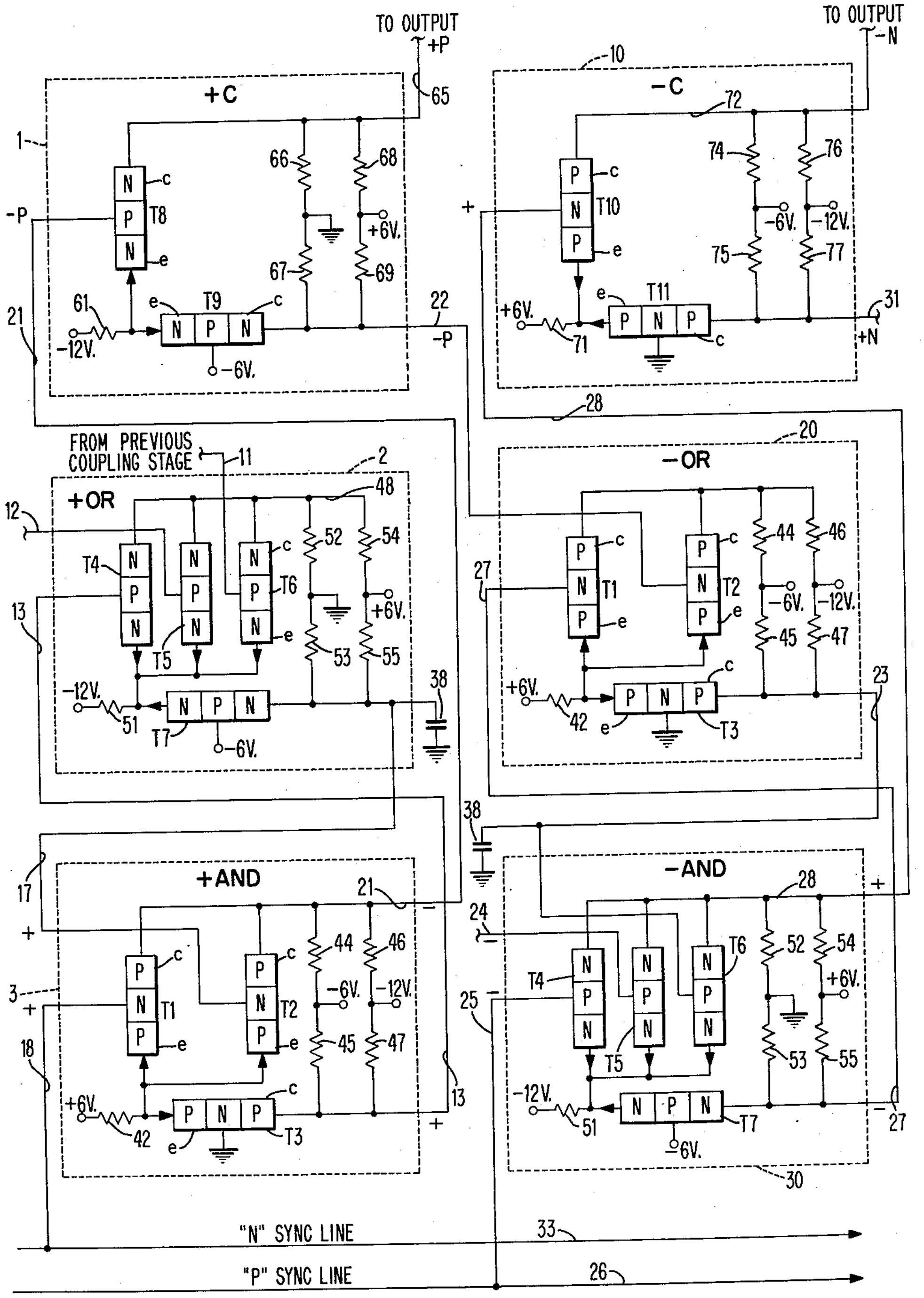
FIG. 3 shows the details of the transistorized componentry in two adjacent stages of the ring.

The details of the positive AND configuration 3 will now be described. Referring to FIG. 3, the positive AND configuration requires a coincidence of positive inputs to yield a positive in-phase output signal and a negative out-of-phase output signal. The positive AND configuration 3 comprises transistors T1, T2 and T3, each of the PNP type. The collectors *c* of transistors T1 and T2 are connected to the out-of-phase line 21. The emitters *e* of these transistors are connected to a source of +6 volts by way of a 1K resistor 42. The transistor T3 has its emitter connected to the resistor 42, and the base region N grounded. The collector *c* thereof is connected to the in-phase line 13. Voltage sources of —6 volts and —12 volts are connected, in the manner shown, to lines 21 and 13 by way of a resistance network comprised of 360 ohm resistors 44 and 45 and 2.4K ohm resistors 46 and 47.

Positive signal inputs to the N base regions of the transistors T1 and T2 are applied by way of lines 17 and 18. These applied signals have a nominal excursion of 1.6 volts. The transistors T1 and T2 constitute the basic elements of the AND circuit, with transistor T3 being employed as a grounded base amplifier driven by the emitter outputs of the transistors T1 and T2. The transistor T3 is thus forward-biased only when its emitter is above ground potential. Because these transistors have a forward emitter-to-base drop of 0.2 volt, a negative N input will drive the emitter line below ground and reverse-bias the transistor T3. In this condition, the output of line 13 will assume a —6.8 volt level (—P) as a result of divider current flow through the resistance network. Concurrently, the output on the line 21 assumes a level of —5.2 volts (+P) because of current flow into the resistance network, through the transistors T1 and T2 from the +6 volts supply.

When the inputs to the transistors T1 and T2 are positive, the emitter of transistor T3 attempts to rise above ground. In so doing, it becomes forward-biased and clamps to its base potential. In this state, inputs to the transistors T1 and T2 are cut off so that the output on the line 21 falls to a —P level and the output on the line 13 rises to a +P level because of the transistor T3 being on.

Details of the positive OR configuration 2 will now be described. Referring to FIG. 3, the positive OR configuration 2 comprises transistors T4, T5, T6 and T7, each being of the NPN type. The collectors of transistors T4, T5 and T6 are connected in common to line 48, and the emitters of these transistors are connected in common to a —12 volt source by way of a 1K resistor 51. The transistor T7 has its emitter connected to the resister 51 and its base connected to a —6 volt supply, and the collector connected to the in-phase line 17. The lines 48 and 17 are connected to ground and a +6 volt supply by way of a resistor network constituted of 360 ohm resistors 52 and 53 and 2.4K resistors 54 and 55. Input signals to the P base regions of the transistors T4, T5 and T6 are applied by way of line 13, line 12 and line 11, respectively.

The configuration, when used as an OR circuit, is predicated on positive logic, but, when used as an AND circuit, is predicated on negative logic. When used as a positive OR circuit, any positive input yields a positive in-phase output. When used as a negative AND circuit, all inputs must be negative to yield a negative in-phase output. In the configuration shown, the emitter output drives the grounded base amplifier transistor T7, referenced at —6 volts. When the inputs are at a —P level, the emitter common line attempts to fall to a —P level. When the emitter of transistor T7 falls below —6 volts, it becomes forward-biased and clamps to the base potential of —6 volts. In this state, the output line 17 is at a —0.8 volt level (—N level) because of the current flow through the resistor network, transistor T7, resistor 51 and the —12 volt supply. The voltage on line 48 at this time is at a +0.8 volt (+N level) because of divider current through the network. When any input rises sufficiently above —6 volts, the emitter line follows it and transistor T7 is reverse-biased and cuts off. Thus, the output on the line 17 rises to a +N level and the line 48 falls to a —N level of —0.8 volt.

The converter will now be described in detail. Referring to FIG. 3, the converter configuration 1 employs NPN-type transistors T8 and T9, the emitters *e* of which are connected to a —12 volt supply by way of a 1K resistor 61. The collector *c* of transistor T8 is connected to a line 65, while the collector *c* of transistor T9 is connected to the line 22. The base region P of the transistor T9 is connected to a reference level of —6 volts. The lines 65 and 22 are connected to a resistor network constituted of 360 ohm resistors 66 and 67 and to 2.4K ohm resistors 68 and 69. A —P signal, when applied to the base input region of T8, yields a —N level output on the line 22 and a +N level on the line 65.

The converter 1 is employed to convert a P level signal to an N level signal.

The configuration 10 is employed for converting N level signals to P level signals. The converter 10 employs PNP-type transistors T10 and T11, the emitters of which are connected to a +6 volt supply by way of a 1K resistor 71. The collectors *c* of transistor T10 and transistor T11 are connected to lines 72 and 31, respectively. These lines, in turn, are connected to a resistor network constituted of 360 ohm resistors 74 and 75 connected to a —6 volt supply, and 2.4K resistors 76 and 77 connected to a —12 volt supply. An input of a +N level to the N base region T10 yields a +P level signal on the line 31 and a —N level signal on the line 72.

From an inspection of converters 1 and 10, it may be seen that the former is predicated on positive logic and the latter on negative logic.

The configuration 20 is employed as a negative OR circuit and is constituted of transistors T1, T2 and T3 connected to a resistance network similar to that described for the positive AND configuration. Inputs to the transistors T1 and T2 are applied by way of the lines 27 and 22, respectively. The application of a —N signal to either input line causes the configuration to yield a —P signal on the in-phase output line 23.

The configuration 30 is a negative AND configuration constituted of the transistors T4, T5, T6 and T7 connected in the manner shown. This AND configuration is the same as the positive OR configuration described above. This negative AND configuration is responsive to a coincidence of three —P input signals to yield a —N signal on the in-phase output line 27 and, at the same time, a +N signal on the out-of-phase line 28.

Figure 4:
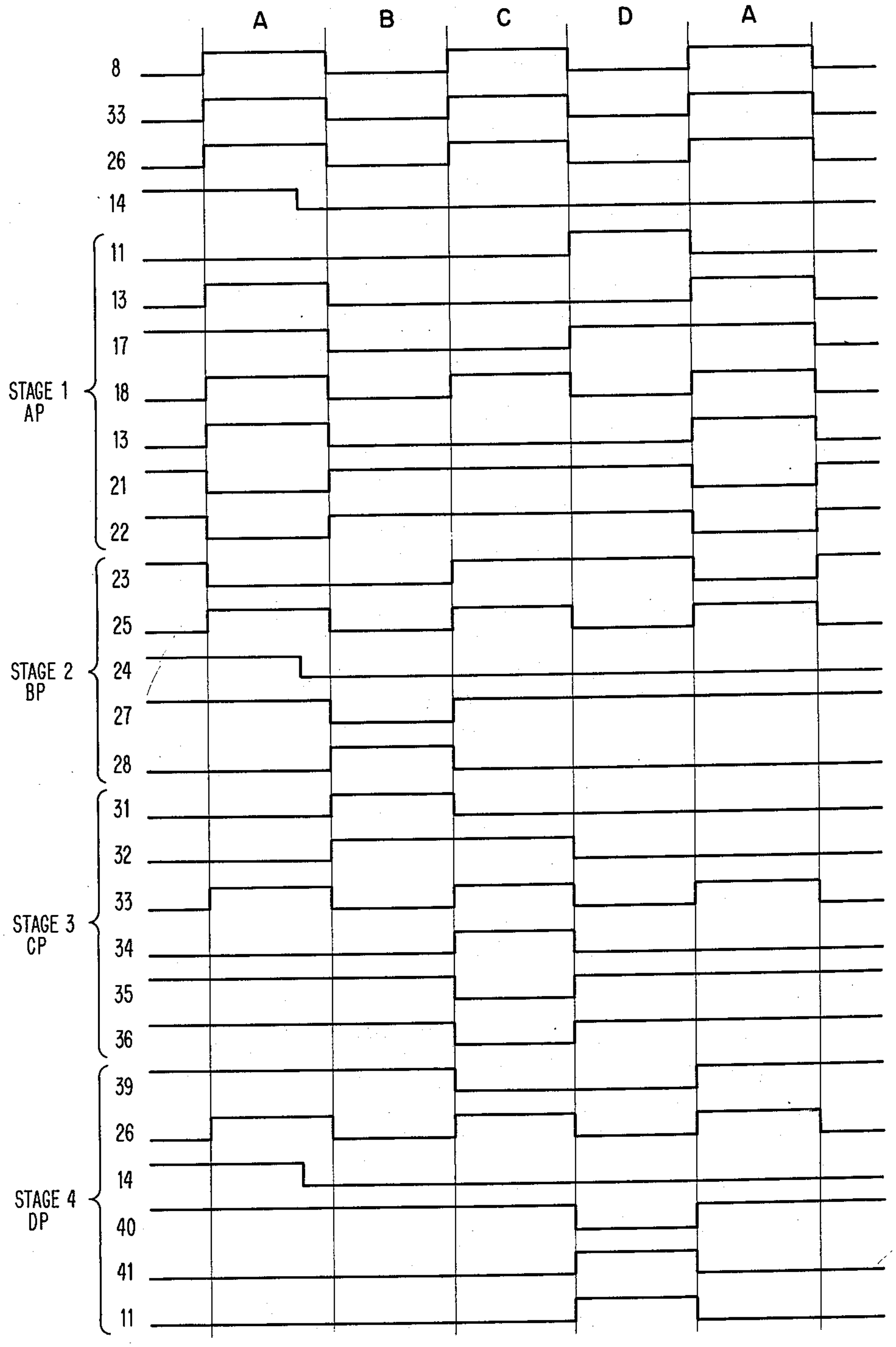
FIG. 4 is a time chart of operation of the invention.

In the time chart of FIG. 4, the legends A, B, C and D across the top of the chart indicate the basic 4-pulse time durations of the ring, each stage thereof issuing a different one of the four pulses; for example, stage 1 issuing the A pulse, stage 2 issuing the B pulse, etc. The legends to the left of each waveform indicate the reference numbers associated with the various connection lines of the ring. For example, the first three waveforms at the top of the chart represent the signals impressed on the lines 8, 33 and 26, respectively. To explain the operations of the ring, it is assumed that all four stages are off. Stage 1 is turned on as follows. When the P reset line 14 comes up, the P signal is applied to the positive OR gate 2 by way of the line 12 and emerges from the gate 2 as +N signal on the line 17 connected to the AND switch 3, at the same time a +N signal is applied to AND gate 3 by way of the line 18. The coincidence of these two N signals causes a +P signal to be impressed on the in-phase line 13 and a —P signal to be impressed on the out-of-phase line 21. When the signal level on the reset line 14 drops, coincidence is maintained on the AND switch 3 by means of the path from line 13 through the positive OR gate 2 and on the in-phase line 17 to the AND switch 3. Thus, during the A time interval, stage 1 issues bipolar signals; namely, +P on the line 13 and —P on the line 21. When the +N signal shifts to a —N level on the lines 33 and 18, coincidence on the AND switch 3 terminates; hence, stage 1 is turned off. It is seen that, when the P reset line was initially up, the negative AND switch 30 of stage 2 was not responsive. Hence, stage 2 did not go on at the same time that stage 1 was turned on.

When stage 1 goes off, stage 2 is turned on upon a coincidence of —P signals at the inputs to the negative AND switch 30. This is accomplished during the B interval of the time chart, wherein it will be seen that the character of the waveforms on the lines 23, 24 and 25 are at a —P level. During this B interval, the AND switch 30 provides a —N signal on the in-phase line 27 and a +N signal on the out-of-phase line 28. Upon termination of negative coincidence on the negative AND switch 30, stage 2 is turned off and stage 3 is turned on. The turning on of stage 3 is effected in response to the coincidence of +N signals at the inputs to the positive AND switch 3′. Stage 3 is on during the C time interval during which the in-phase output line 34 provides a +P signal and the out-of-phase line 35 provides a —P signal. Upon termination of coincidence at switch 3′, stage 3 is turned off and stage 4 goes on. A coincidence of —P signals at the input of negative AND switch 30′ causes the stage 4 to go on. These —P signals are applied by way of the lines 39, 14 and 26. The stage 4 is on during the D time interval, during which the AND switch 30′ causes the in-phase output line 40 to provide a —N signal and the out-of-phase line 41 to provide a +N signal. Upon termination of coincidence at the AND switch 30′, stage 4 is turned off and stage 1 is turned on under control of a P signal passing from the converter 10′ of stage 4 through the line 11 through the OR gate 2, which causes a +N signal to be impressed on the line 17 to the AND switch 3 at the same time that line 18 provides a +N signal on the AND switch 3. Operations of the ring are repeated in the manner described to again provide the A, B, C and D bipolar signals.

Each OR device, in combination with its associated AND device, has also the function of a latch for maintaining the associated stage in a latched position during one of the four time divisions of the ring. In the basic ring configuration of FIG. 1, each converter is adapted to accept a signal or one character from its associated stage, translate or convert this signal into a signal of opposite character for transmission to the next immediate succeeding stage of the ring. The ring employs positive and negative logic to advantage. It initially selects and gates through a positive sync pulse, which in turn conditions the next stage to gate through the succeeding negative sync pulse. By virtue of this positive and negative logic arrangement in adjacent stages, the ring is provided with an interlock feature that prevents a succeeding stage from being turned on while the preceding stage is on. The interlock feature thus insures that one stage and only one stage will be on at any one time interval.

It may be appreciated that, by using a closed ring of but two positions, the invention may thus be utilized as a 2-position binary register or a flip-flop device.

Figure 2:
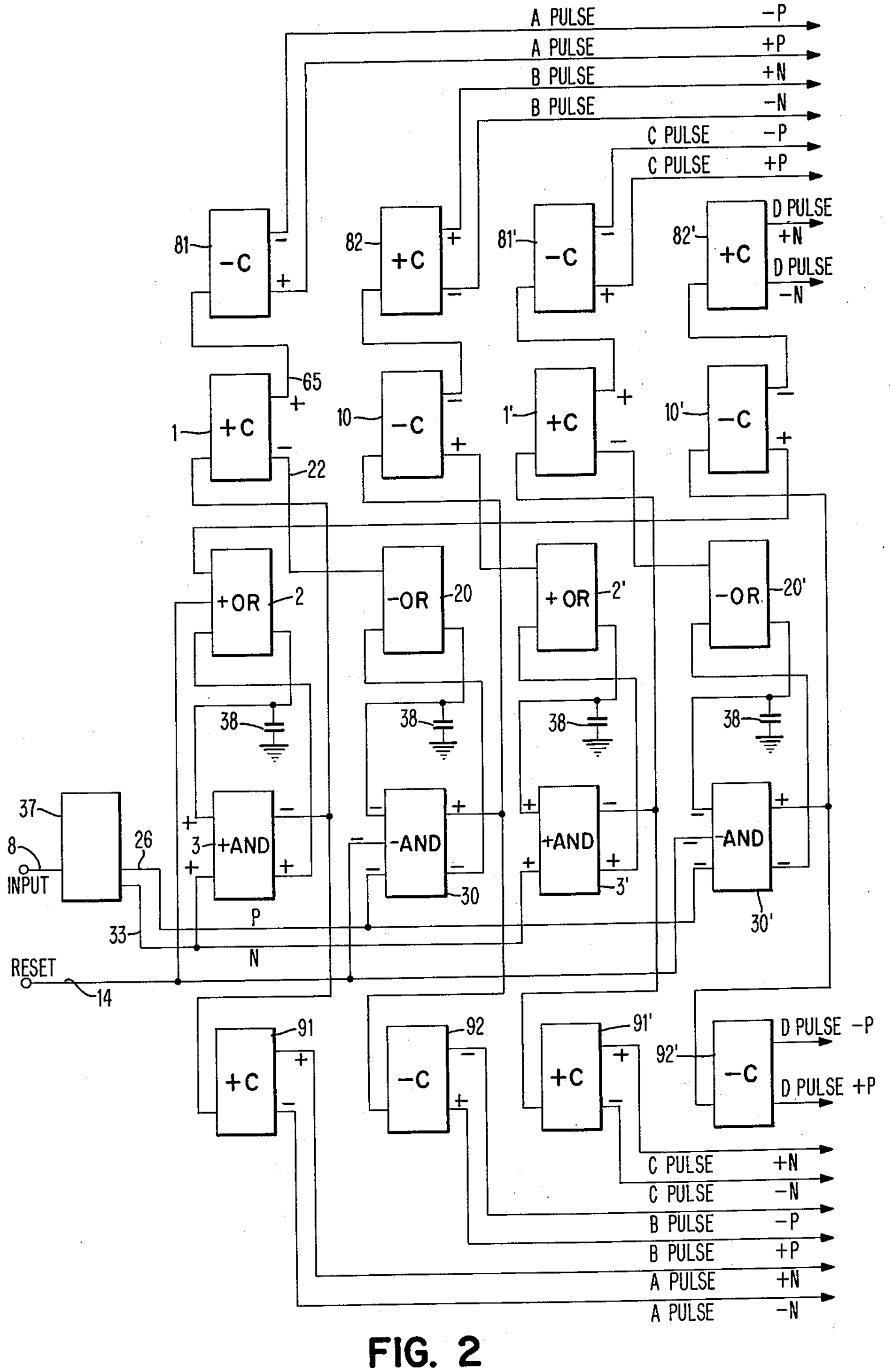
FIG. 2 shows a second embodiment of a 4-stage ring.

The arrangement of FIG. 2 comprises the basic ring of FIG. 1 together with additional buffer converters that increase the over-all flexibility, versatility and speed of operation of the ring. The configuration of FIG. 2 provides bipolar levels as well as bipolar signals for each ring stage. The additional buffer converters are shown in a row across the top and bottom of the drawing of FIG. 2. At the top, reading from left to right, the buffer converters are referenced 81, 82, 81′ and 82′. Buffer converters 81 and 81′ are predicated on negative logic and are similar in every respect to the converter 10 previously described. Converters 82 and 82′ are predicated on positive logic and are similar in every respect to the converter 1 previously described. At the bottom of the drawing, reading from left to right, the buffer converters are referenced 91, 92, 91′ and 92′. Buffer converters 91 and 91′ are predicated on positive logic and are similar in every respect to the converter 1 previously described. Buffer converters 92 and 92′ are predicated on negative logic and are similar in every respect to the converter 10 previously described. These two rows of buffer converters now provide for each stage of the ring signals of the following character: +P, —P, +N and —N.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A sequentially operable switching ring for issuing bipolar signals comprising: a first stage of positive logic elements responsive to a coincidence of at least two positive signals to provide P type bipolar signals having voltage excursions referenced to a negative potential; a second stage of negative logic elements responsive to a coincidence of at least two negative signals to provide N type bipolar signals having voltage excursions referenced to a zero potential; interstage coupling means responsive to one type of said bipolar signals issued by a stage to provide a converted signal which is of the other type to the immediate following stage; a source of recurring positive and negative signals including means for supplying said signals to the respective positive and negative logic elements; and logic means for gating each stage of logic elements with the appropriate converted signal to effect coincidence in the signals applied to each stage, thereby rendering said stages sequentially operable.

2. A ring as in claim 1 further characterized in that said P type bipolar signals have a nominal excursion of 1.6 volts and are referenced to a —6 volt potential, and that said N type bipolar signals have a nominal excursion of 1.6 volts and are referenced to a zero voltage.

3. A ring as in claim 2 further characterized in that said positive and negative recurring signals are in phase with each other.

4. In a switching ring of the character described, a plurality of + stages, each constituted of logic configuration responsive to a coincidence of + signals to provide bipolar P type signals; a plurality of — stages, each constituted of logic configurations responsive to a coincidence of — signals to provie bipolar N type signals; coupling means for interconnecting the stages in alternate sequence, such that a + stage is interconnected between — stages and a — stage is interconnected between + stages, said coupling means including means for converting and transmitting one of said bipolar signals from one stage to a succeeding stage; a source of recurring positive and negative in-phase signals including means for applying said signals to said stages; and gating means in each stage for gating the converted one bipolar signal with the appropriate recurring positive and negative signals to effect coincidence in the respective logic configurations of each stage.

5. In a switching ring of the character described, a plurality of + stages, each constituted of transistorized logic configurations responsive to a coincidence of + signals to provide bipolar P type signals having excursions of 1.6 volts about a −6 volt reference voltage; a plurality of − stages, each constituted of transistorized logic configurations responsive to a coincidence of − signals to provide bipolar N type signals having excursions of 1.6 volts about a zero reference voltage; coupling means for interconnecting the stages in alternate sequence, such that a + stage is interconnected between − stages and a − stage is interconnected between + stages, said coupling means including means for converting and transmitting one of said bipolar signals from one stage to a succeeding stage; a source of recurring positive and negative in-phase signals including means for applying said signals to said stages; and gating means in each stage for gating the converted one bipolar signal with the appropriate recurring positive and negative signals to effect coincidence in the respective transistorized logic configurations of each stage.

6. In a switching ring of the character described, a plurality of + stages, each constituted of logic configurations responsive to a coincidence of + signals to provide bipolar P type signals; a plurality of − stages, each constituted of logic configurations responsive to a coincidence of − signals to provide bipolar N type signals; coupling means for interconnecting the stages in alternate sequence, such that a + stage is interconnected between − stages and a − stage is interconnected between + stages, said coupling means including means for converting and transmitting one of said bipolar signals from one stage to a succeeding stage; a source of recurring positive and negative in-phase signals including means for applying said signals to said stages; gating means in each stage for gating the converted one bipolar signal with the appropriate recurring positive and negative signals to effect coincidence in the respective logic configurations of each stage; and additional converting means in each stage, each such converting device responsive to one of the bipolar signals of the associated stage to issue bipolar signals which is the complement of said one of the bipolar signals.

7. In a switching ring of the character described, the combination comprising: a logical AND configuration having at least two input lines, an in-phase output line and an out-of-phase output line; a logical OR configuration having at least two input lines and an in-phase output line; means connecting the latter to one of the AND input lines; a latch back path connecting said out-of-phase output line to one of the OR input lines; and a source of recurring signals, including means for applying said signals to the second AND input line and to the second OR input line, to cause said AND configuration to issue an in-phase output signal and an out-of-phase output signal.

8. In a switching ring of the character described, the combination comprising: a logical AND configuration having at least two input lines, an in-phase output line and an out-of-phase output line; a logical OR configuration having at least two input lines and an in-phase output line; means connecting the latter to one of the AND input lines; a latch back path connecting said out-of-phase line to one of the OR input lines; delay means connected to said latch back path; and a source of recurring signals, including means for applying said signals to the second AND input line and to the second OR input line to cause said AND configuration to issue an in-phase output signal and an out-of-phase output signal.

9. In a switching ring of the character described, the combination comprising: a logical AND configuration having at least two input lines, an in-phase output line and an out-of-phase output line; a logical OR configuration having at least two input lines and an in-phase output line; means connecting the latter to one of the AND input lines; a latch back path connecting said out-of-phase output line to one of the OR input lines; a grounded capacitor connected to said latch back path; and a source of recurring signals, including driver means for applying said signals to the second AND input line and to the second OR input line, to cause said AND configuration to issue an in-phase output signal and an out-of-phase output signal.

References Cited in the file of this patent

UNITED STATES PATENTS

| | | |
|---|---|---|
| 2,882,423 | MacSorley | Apr. 14, 1959 |
| 2,950,461 | Tryon | Aug. 23, 1960 |

OTHER REFERENCES

R. K. Richards: "Arithmetic Operations in Digital Computers," Van Nostrand, 1955, pp. 202–207.